(12) United States Patent
Lue

(10) Patent No.: US 7,391,652 B2
(45) Date of Patent: Jun. 24, 2008

(54) METHOD OF PROGRAMMING AND ERASING A P-CHANNEL BE-SONOS NAND FLASH MEMORY

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/381,760

(22) Filed: May 5, 2006

(65) Prior Publication Data

US 2007/0258289 A1 Nov. 8, 2007

(51) Int. Cl.
*G11C 16/04* (2006.01)

(52) U.S. Cl. .............................. 365/185.28; 365/185.17; 365/185.18

(58) Field of Classification Search ............. 365/185.28
See application file for complete search history.

(56) References Cited

U.S. PATENT DOCUMENTS

| | | | | |
|---|---|---|---|---|
| 6,801,456 B1* | 10/2004 | Hsu et al. | ............... | 365/185.18 |
| 6,888,753 B2* | 5/2005 | Kakoschke et al. | .... | 365/185.11 |
| 6,952,369 B2* | 10/2005 | Hsu et al. | ............. | 365/185.18 |
| 7,133,316 B2* | 11/2006 | Lue | ........................ | 365/185.28 |
| 7,180,125 B2* | 2/2007 | Wang | ........................ | 257/315 |
| 7,200,040 B2* | 4/2007 | Liu | ........................ | 365/185.18 |

* cited by examiner

*Primary Examiner*—Son L. Mai
(74) *Attorney, Agent, or Firm*—Jianq Chyun IP Office

(57) ABSTRACT

A programming method for a p-channel memory cell, the memory cell includes a source, a drain and a gate. The gate is applies with a first voltage, which results in Fowler-Nordheim (−FN) hole injection, thereby causing the memory cell to be in a programmed state.

7 Claims, 14 Drawing Sheets

METHOD OF PROGRAMMING AND ERASING A P-CHANNEL BE-SONOS NAND FLASH MEMORY

BACKGROUND OF THE INVENTION

1. Field of the Invention

This invention relates to a flash memory device, and more particularly, to a flash memory device employing p-channel cells.

2. Description of the Prior Art

Conventional NAND-type floating gate flash memories are used in many non-volatile storage applications because they can be fabricated with a high density. In addition, they can operate at low-power and have high-speed page programming throughput.

FIG. 1 shows a conventional NAND floating gate flash memory using n-channel type memory cells. Each n-channel memory cell can be either a floating gate device or a silicon-oxide-nitride-oxide-silicon (SONOS) type device. Programming the conventional memory device may be performed by using positive Fowler-Nordheim (+FN) electron injection, where electrons are injected from an inversion channel into a floating gate or a nitride trapping layer of the memory cell. Conversely, erasing may be performed by negative Fowler-Nordheim (−FN) electron injection, where the electrons are injected from the floating gate into the channel. For example, a voltage of Vg=+18 volts is applied to a selected word line, e.g., $WL_{N-1}$, which is connected to the gates of the n-channel memory cells marked A and B. A voltage of Vg=+10 is applied to all other (unselected) word lines (i.e., gates), including bit-line transistors (BLT) and source line transistors (SLT) of the memory device. The application of a positive gate voltage to all of the cells causes all of the MOSFET transistors in each NAND string of the conventional device to be turned-on, causing an inversion layer to formed that passes through the NAND strings. Referring again to FIG. 1, a first bit line ($BL_1$) is set to a zero volt bias (i.e., $V_{BL1}$=0V) or ground potential and therefore, the inversion layer in the cells connected to $BL_1$ has a zero potential. However, a second bit line ($BL_2$) is set to a positive voltage potential (i.e., $V_{BL2}$=+8V), and therefore the inversion layer in the cells connected to $BL_2$ is at a high potential.

Programming of a cell is accomplished by providing a large enough gate to source voltage in each cell to cause +FN injection to occur. Referring to FIG. 1, cell-A is selected by creating a large voltage drop across the cell. Specifically, since cell-A is connected to bit line $BL_1$, which has a $V_{BL1}$=0V and to word line $W_{LN-1}$=+18V, a voltage drop of +18V is created across the cell. The +18V voltage drop provides for an efficient +FN injection, causing the voltage threshold in the cell to be raised to a higher programmed state (PV). Since cell-B is connected to bit line $BL_2$ and to $W_{LN-1}$, which are respectively biased at $V_{BL2}$=+8V and $W_{LN-1}$=+18V, a voltage drop of only +10V is created across cell-B. The +10V voltage drop is insufficient to cause +FN injection. Cell-C is connected to bit line $B_{L1}$ and word line $W_{L1}$, which are biased at $V_{BL1}$=0V and $WL_1$=+10V, thus creating a voltage drop of +10V across cell-C. Thus, any +FN effect is negligible for cell-C. Therefore, by the aforementioned method, individual cells may be programmed.

NAND n-channel floating gate flash memory devices are in widespread use. Many NAND flash memory devices are implemented with multi-level cell (MLC) technology which requires a more precise voltage threshold (Vt) distribution and control, thus require tighter control of process variables, than non-MLC applications. In addition, there is currently no known convergent +FN programming technique available for n-channel NAND floating gate flash memory devices. Further, due to the inter-floating gate structure of n-channel devices, there is a coupling effect between memory cells, thereby limiting the scaling of conventional NAND-type floating gate devices to greater densities.

BRIEF SUMMARY OF THE INVENTION

In accordance with an embodiment of the present invention, there is provided a programming method for a p-channel memory cell, the memory cell includes a source, a drain and a gate, by applying a first voltage to the gate, resulting in negative Fowler-Nordheim (−FN) hole injection, thereby causing the memory cell to be in a programmed state.

Also in accordance with another embodiment of the present invention, there is provided an erasing method for a p-channel memory cell, the memory cell includes a source, a drain and a gate, by applying a first voltage to the gate, resulting in positive Fowler-Nordheim (+FN) electron injection, thereby causing the memory cell to be in an erased state.

Further in accordance with yet another embodiment of the present invention, there is provided a reading method for a p-channel memory cell, the memory cell includes a source, a drain and a gate, by applying a first voltage to the source; applying a second voltage to the drain, wherein the first voltage is greater than the second voltage; detecting a state of the memory cell for selecting a third voltage; and applying the third voltage to the gate, wherein the third voltage is greater than the first voltage and the second voltage.

Still in accordance with yet another embodiment of the present invention, there is provided a programming method for a memory device, the memory device comprises a NAND array of memory cells, the array comprises one or more word lines and (WL) one or more bit lines (BL), each bit line comprises a bit line transistor (BLT) connected to a string of p-channel memory cells, the string of p-channel memory cells including N series connected memory cells and the $N^{th}$ memory cell connected to a source line transistor (SLT). A first voltage is applied to each bit line (BL) that corresponds to each selected string of memory cells in the array of memory cells. A second voltage is applied to each bit line (BL) that corresponds to each unselected string of memory cells, wherein the first voltage is greater than the second voltage. A third voltage is applied to each bit line transistor (BLT), wherein the second voltage is greater than the third voltage. The third voltage is applied to each source line transistor (SLT) and to each word line (WL) that corresponds to each unselected memory cell. A forth voltage is applied to the word line (WL) that corresponds to each selected memory cell, resulting in Fowler-Nordheim (−FN) hole injection, thereby causing the memory cell to be in a programmed state, wherein the third voltage is greater than the forth voltage.

Further in accordance with yet another embodiment of the present invention, there is provided a programming method for a memory device, the memory device comprises a NAND array of memory cells, the array comprises one or more word lines and (WL) one or more bit lines (BL), each bit line comprises a bit line transistor (BLT) connected to a string of p-channel memory cells, the string of p-channel memory cells including N series connected memory cells and the $N^{th}$ memory cell connected to a source line transistor (SLT). A first voltage is applied to each bit line (BL) that corresponds to each selected memory cell in the array of memory cells. A second voltage is applied to each bit line (BL) that corresponds to each unselected memory cell, wherein the first voltage is greater than the second voltage. A third voltage is applied to each bit line transistor (BLT), wherein the second voltage is greater than the third voltage. The first voltage is applied to each source line transistor (SLT). The second voltage is applied to each word line (WL) that corresponds to each unselected memory cell. A forth voltage is applied to the word line (WL) that corresponds to each selected memory cell, resulting in Fowler-Nordheim (−FN) hole injection, thereby causing the memory cell to be in a programmed state, wherein the third voltage is greater than the forth voltage.

Further still in accordance with yet another embodiment of the present invention, there is provided an erasing method for a memory device, the memory device comprising a NAND array of memory cells, the array comprises one or more word lines and (WL) one or more bit lines (BL), each bit line comprises a bit line transistor (BLT) connected to a string of p-channel memory cells, the string of p-channel memory cells including N series connected memory cells and the $N^{th}$ memory cell connected to a source line transistor (SLT). A first voltage is applied to each bit line transistor (BLT). The first voltage is applied to each source line transistor (SLT). A second voltage is applied to each selected word line in the array of memory cells corresponding to each selected memory cell, resulting in Fowler-Nordheim (+FN) electron injection, thereby causing an erased state in each of the selected cells, and wherein the second voltage is greater than the first voltage.

Yet still in accordance with yet another embodiment of the present invention, there is provided a reading method for a memory device, the memory device comprises a NAND array of memory cells, the array comprises one or more word lines and (WL) one or more bit lines (BL), each bit line comprises a bit line transistor (BLT) connected to a string of p-channel memory cells, the string of p-channel memory cells including N series connected memory cells and the $N^{th}$ memory cell connected to a source line transistor (SLT). A first voltage is applied to each bit line (BL) that corresponds to each selected memory cell in the array of memory cells. A second voltage is applied to each bit line transistor (BLT), wherein the first voltage is greater than the second voltage. The second voltage is applied to each source line transistor (SLT). The second voltage is applied to each word line (WL) that corresponds to each unselected memory cell. A third voltage is applied to the gate, wherein the third voltage is greater than the first and the second voltages.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
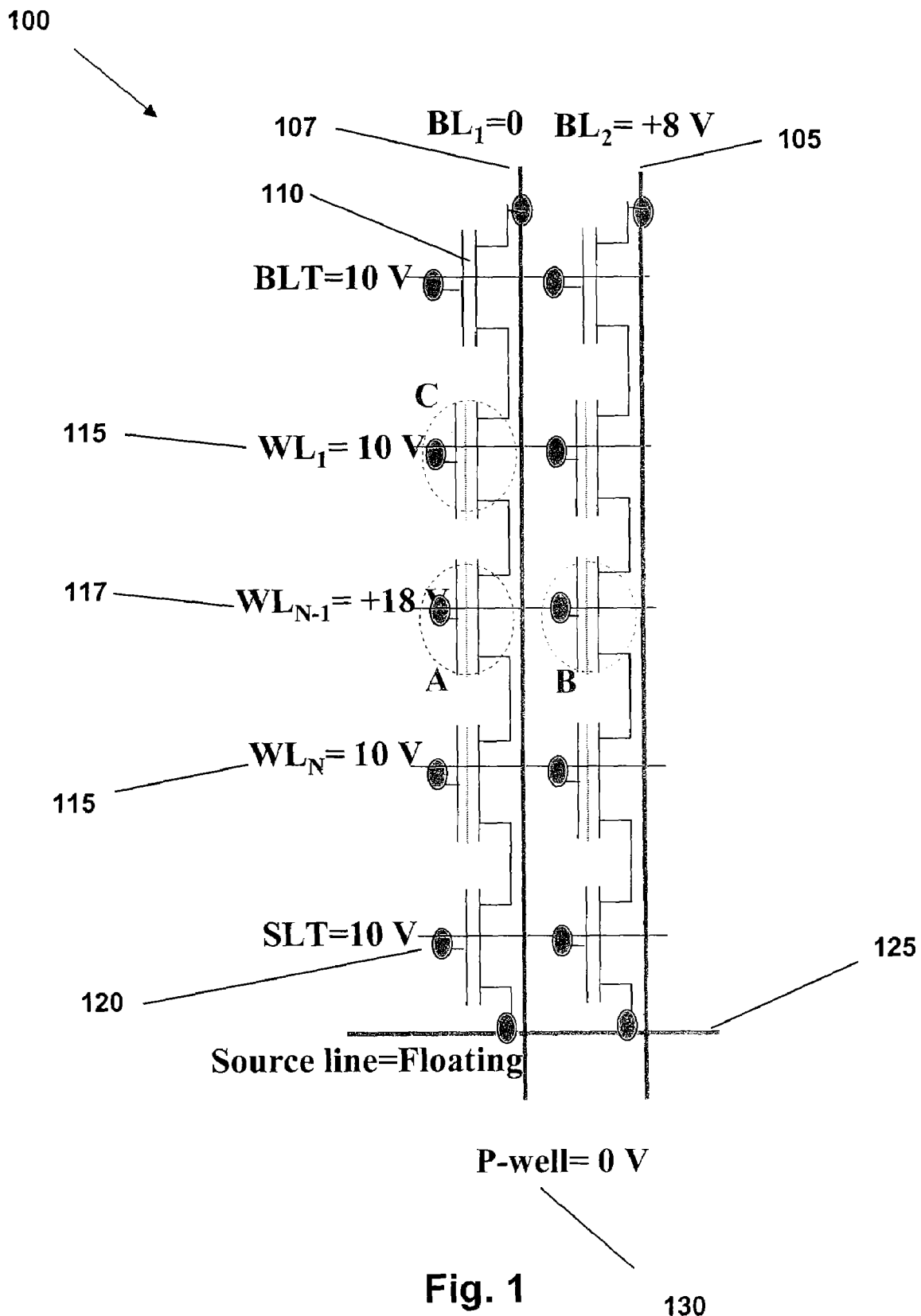
FIG. 1 is a schematic representation for a programming method of a conventional prior art NAND flash n-channel memory device.

Reference will now be made in detail to the invention and the presently preferred embodiments thereof, examples of which are illustrated in the accompanying drawings. Wherever possible, the same or similar references are used in the drawings and the description to refer to the same or like parts. It should be noted that the non-graph drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are known in the art or to be developed.

Figure 2:
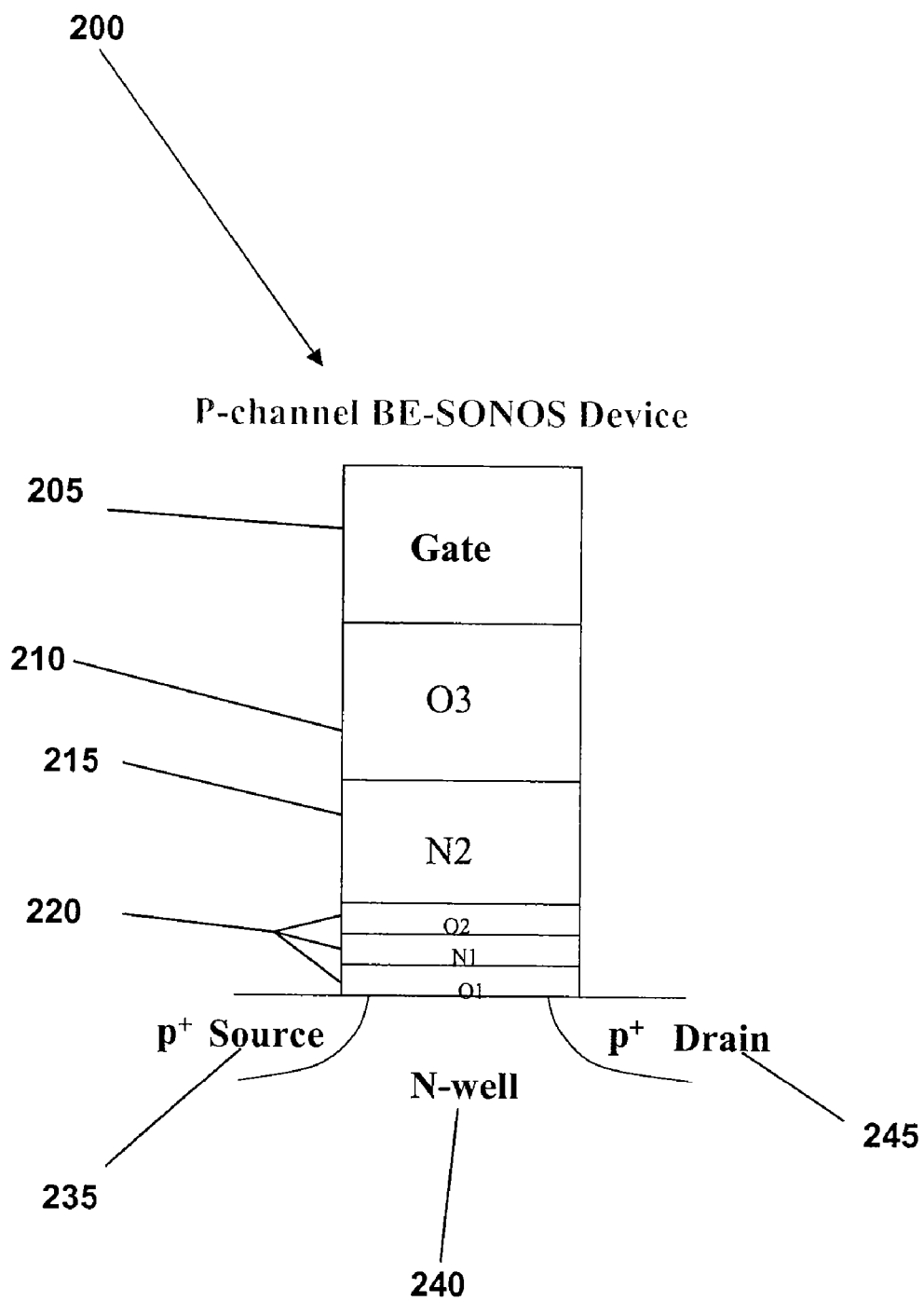
FIG. 2 is a cross-sectional view of a BE-SONOS p-channel memory cell with an ONO tunneling dielectric according to a preferred embodiment of the present invention.

FIG. 2 is a cross-sectional view of a band-gap engineered-silicon-oxide-nitride-oxide-silicon (BE-SONOS) flash p-channel memory cell 200 with an ONO tunneling dielectric 220 in accordance with a preferred embodiment of the present invention. The BE-SONOS p-channel memory cell 200 includes an n-type substrate 240 (e.g., N-well) including a control gate 205 made of n+ poly gate, a p+ poly gate or similar materials. The memory cell 200 includes a p+ source region 235, a p+ drain region 245, and a channel region interposed between the source 235 and drain regions 245 in the N-well 240 of the substrate. A nitride charge-trapping storage, or charge storage, layer 215 is provided above the channel region, a multi-layer modulated tunneling dielectric layer 220 is provided between the nitride charge-trapping layer 220 and the channel region. A blocking insulating oxide layer 210 is provided between the nitride charge-trapping layer 220 and the control gate 205. When configured as a memory device (see following), the control gate 205 corresponds to a word line, the source region 235 corresponds to a first bit line, and the drain region 245 corresponds to a second bit line. Each memory cell includes a first bit portion and a second bit portion, each of which is for storing one bit of information in the memory cell.

Typical device parameters for the BE-SONOS p-channel memory cell 200 of FIG. 2 are described as follows. Each layer of the BE-SONOS memory cell has a thickness for a bottom oxide layer (O1) about 15 Å (angstroms), an inner nitride layer (N1) about 20 Å (angstroms), inner oxide (O2) about 18 Å (angstroms), trapping-nitride layer (N2) 215 about 70 Å (angstroms), and a blocking oxide layer (O3) 210 about 90 Å (angstroms). The O1/N1/O2 multi-layer modulated tunnel dielectric layer 220 is composed of ultra-thin oxide and nitride, all within 3 nanometers to provide direct hole tunneling. N2 is thicker than 5 nanometers for providing a higher trapping efficiency in the memory cell. For the blocking oxide layer (O3) 210, a preferred formation method is to use a wet converted top oxide that provides a large density of traps between the O3 210 and N2 215, in which O3 210 is about 6 nanometers thick in order to prevent charge losses from the top oxide. O1/N1/O2 serves as a tunneling dielectric for the hole tunneling from an inversion p-channel. As those skilled in the art would understand, the device parameters shown in FIG. 2 are typical and may vary either up or down depending upon the specific application of the memory cell 200.

Figure 3:
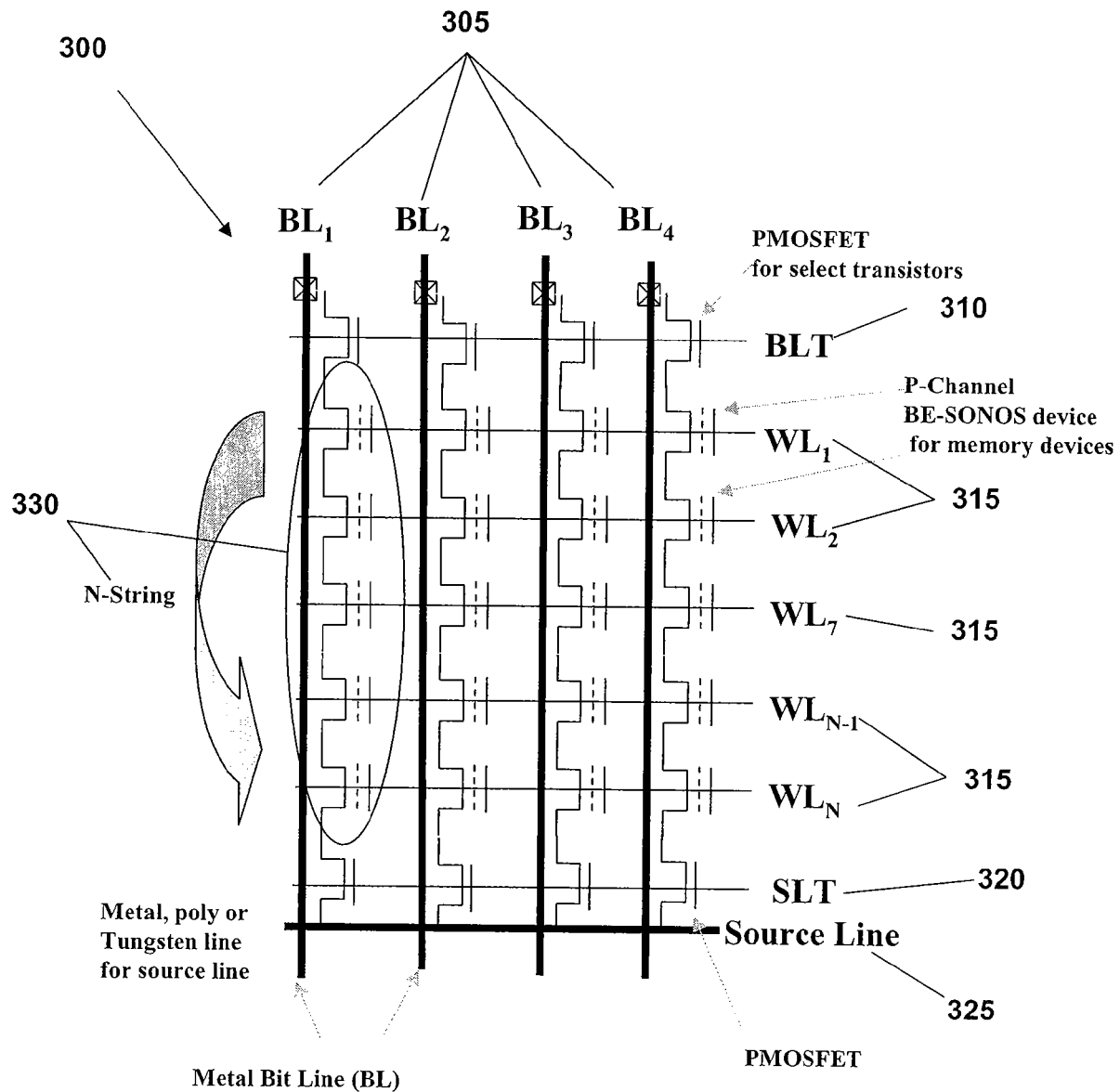
FIG. 3 is a schematic of a NAND flash p-channel memory device using the p-channel memory cell shown in FIG. 2.

FIG. 3 shows a portion of a NAND memory device 300 using the BE-SONOS memory cells 200 shown in FIG. 2. The memory device 300 comprises one or more strings 330 of the memory cells 200 connected in series source-to-drain and drain-to-source. Typically the number of strings 330 in a memory device 300 is 16 or 32, but other sizes of memory devices 300 could be formed. PMOSFET transistors 335 are used as bit select transistors at one end of each string 330 for connecting each string to a bit line 305. The bit select transistors are controlled by bit select line (BLT) 310. PMOSFET select transistors 335 are also located at the other end of each string 330 for connecting each string to a source line (SL) 325. The select transistors are controlled by source select lines (SLT) 320. Preferably, the gate dielectric for the bit line transistors 310 and the source line transistors 320 is a gate oxide without a nitride trapping layer, in order to avoid any possible voltage threshold Vt shift in the bit line transistors 310 and the source line transistors 320 during the device operations. In the preferred embodiment, the bit line transistors 310 and the source line transitors 320 use the same ONONO gate dielectric, which allows the memory cells 200 to operate without any performance degradation. Since the gate voltages on the BLT 310 are often less than ±10 V, very little gate disturbance is present. The source line 325 is made of a metal such as tungsten or a poly material.

Figure 4A:
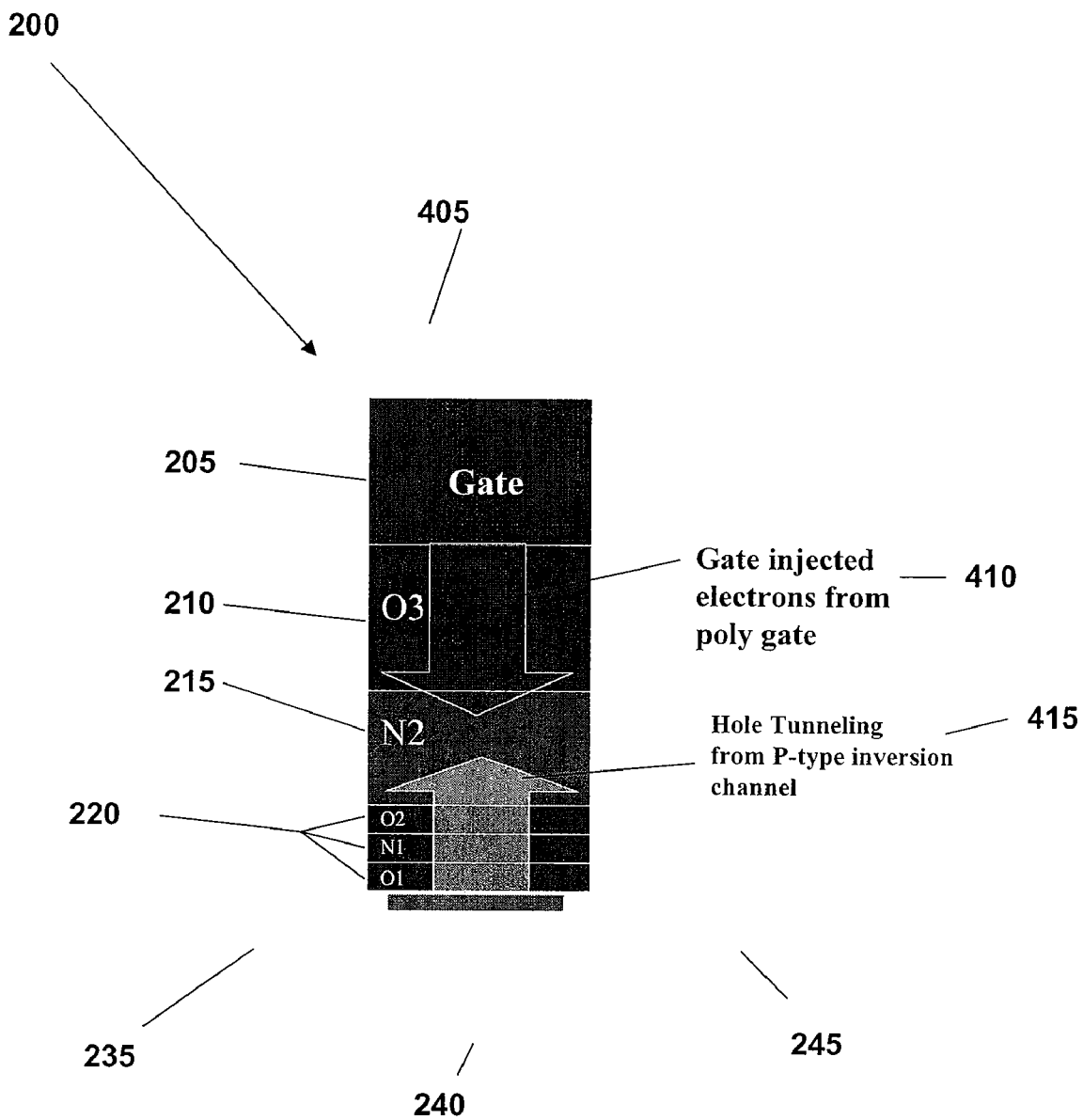
FIG. 4A shows a self-convergent −FN programming method for the BE-SONOS p-channel memory cell of FIG. 2.

FIG. 4A is cross-sectional view of the BE-SONOS p-channel memory cell 200 for performing a self-convergent –FN programming method of the device 200 of FIG. 2. A self-convergent programming operation is generally known in the art and will not be described further herein. However, the self-convergent –FN programming of the present invention provides greater performance and scalability, which facilitates multi-level cell (MLC) devices and applications. Applying a high –FN voltage 405 on the gate 205 (i.e., Vg=−18V), a hole inversion channel 415 is formed in a NAND string 330 of the plurality of memory cells 200 in the p-channel device 400. "Hot" holes then tunnel through the ONO tunneling dielectric layer 220 and are injected into the nitride storage layer 215 (N2). At the same time, "hot' electrons tunnel 410 through the top oxide (O3) layer 210 from the gate 205 into N2 215. The injected holes and electrons will cancel one another until an equilibrium state is reach, thereby setting the threshold voltage of the memory cell 200. The self-convergent programming method of the present invention provides a dynamic balancing condition in the memory cell 200, obviating the need for precise voltage threshold control in programming operations.

Figure 4B:
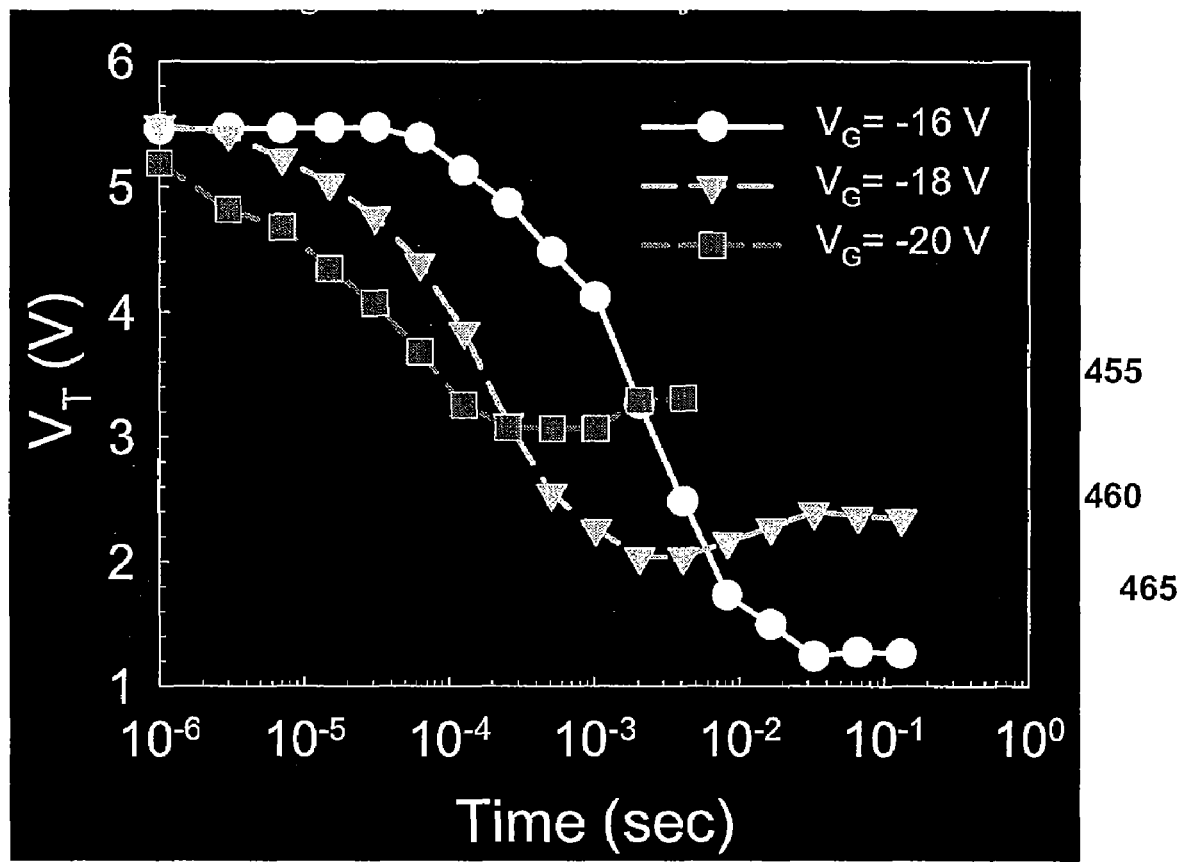
FIG. 4B is a graph illustrating curves of experimental data using different gate voltages for programming the p-channel memory cell of FIG. 2.

Experimental data for the self-convergent –FN programming method is illustrated in FIG. 4B, which shows a difference in threshold voltage for different applied gate voltages. FIG. 4B is a graph illustrating curves of experimental data using different gate voltages for the memory cell 200. FIG. 4B shows that threshold voltage (Vt) may be adjusted by the gate voltage. For example, the threshold voltage (Vt) may be lowered by increasing the absolute value of the gate voltage. In addition, programming speed may also depend on the gate voltages. The different gate voltages illustrate that the higher in voltage for the gate voltage 460 (e.g., Vg=−20V), the faster the device is programmed to a threshold voltage (e.g., Vt=3V at about $5 \times 10^{-3}$ seconds or 5 milliseconds). Conversely, the lower gate voltage 455 (e.g.,=Vg=−16V) is, the device takes longer to program at a threshold level (e.g., Vt=1.2V at about $0.5 \times 10^{-1}$ second or 500 milliseconds), which is about one hundred times slower than that of the higher gate voltage.

Figure 5A:
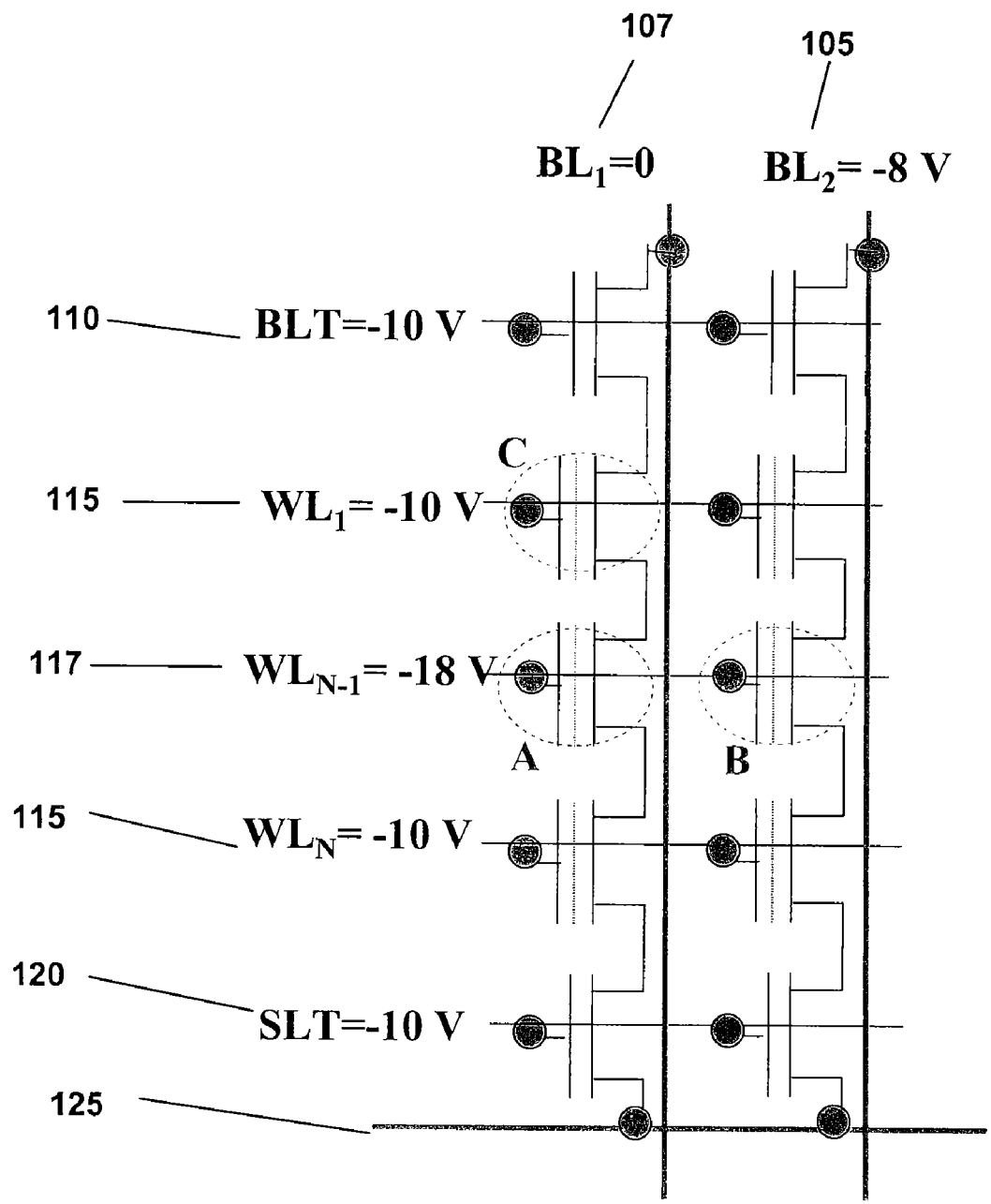
FIG. 5A is a schematic illustrating a first programming method for programming a cell in the memory device shown in FIG. 3.

FIG. 5A is a schematic of the memory device 300 illustrating a program method using an inhibit technique by raising the channel potential of the device. For illustrative purposes, assuming cell-A is selected for programming. The bit line $BL_1$ 107 corresponding to cell-A is set to zero volts ($V_{BL1}$=0V) and bit line $BL_2$ 105 is set to $V_{BL2}$=−8V. The source line 125 is floating and the bulk is set to zero volts or ground. A large negative gate voltage (Vg=−18V) is applied to the word line 117 corresponding to cell-A, and a smaller negative gate voltage (Vg=−10V) is applied to the other word lines 115, 120, BLT 110, and SLT 120. These voltages produce a voltage drop across cell-A of −18V. This voltage drop allows for cell-A to be efficiently programmed using –FN hole injection. Cell-B and cell-C are unselected cells since the voltage drop across the cells (Vg=−10V) is much smaller than that of cell-A and therefore, a much smaller –FN hole injection occurs, if any, for cell-B and cell-C. In other words, write-disturb commonly seen in the programming of conventional devices is minimized, or even eliminated. Therefore, the memory cells in the device of the present invention may be randomly and independently programmed.

Figure 5B:
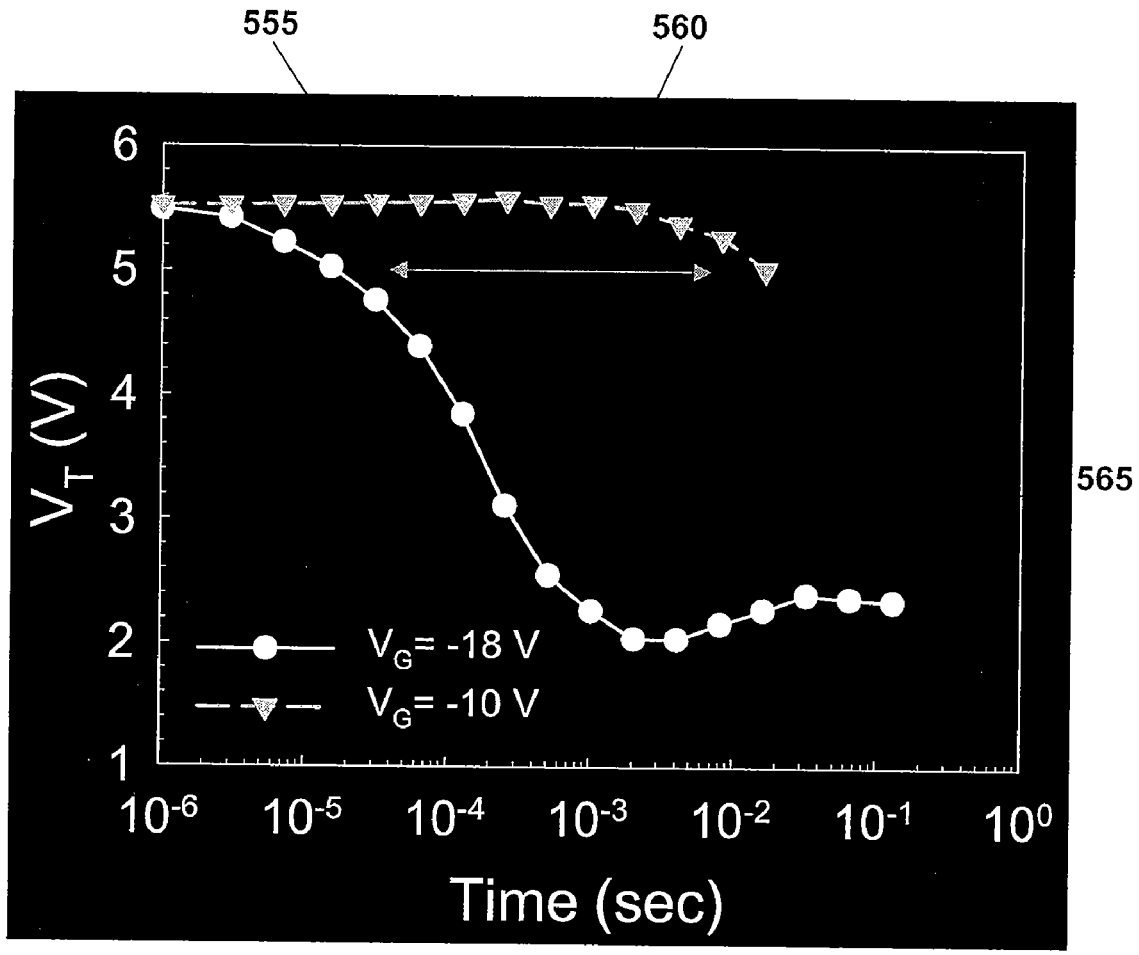
FIG. 5B is a graph illustrating experimental data curves of threshold voltages for memory cells A and B shown in FIG. 5A.

FIG. 5B is a graph illustrating curves of experimental data for the programming method according to the device illustrated in FIG. 5A. When the gate voltage 117 is set to a large negative voltage (e.g., Vg=−18V) for the selected cell, the cell is programmed to a desired voltage threshold or program state (e.g., PV=2.2V). At the same time, the unselected memory cells cell-B and cell-C are biased to produce a voltage drop across the cells of Vg=−10V, which is low enough to inhibit the –FN injection from occurring in the unselected cells. This inhibit programming method provides an inhibit margin that is thirty-two times greater between the selected and unelected cells of the memory device. Therefore, program or write disturb is minimized, or eliminated, thereby allowing for random and independent programming of memory cells.

Figure 6:
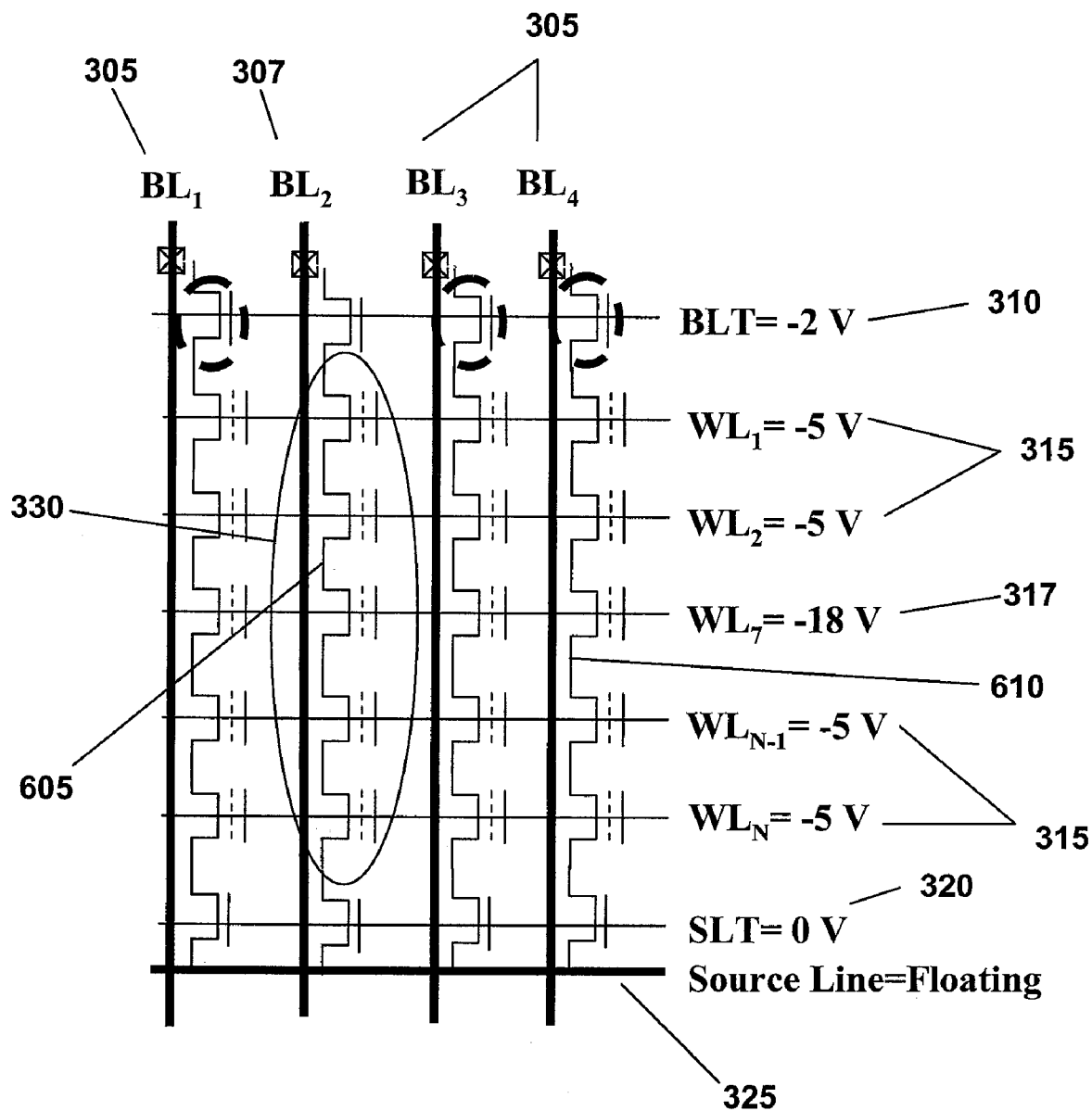
FIG. 6 is a schematic illustrating a second programming method for programming a memory cell in the memory device of FIG. 3.

FIG. 6 is a schematic of the device of FIG. 2, illustrating a program method raising the floating channel potential in the memory device. FIG. 6 illustrates a plurality of bit lines 305 ($BL_1$-$BL_4$), a plurality of word lines 315 ($WL_1$, $WL_2$, $WL_7$, $WL_{N-1}$, $WL_N$), bit line P-MOSFET select transistors 310

(BLT), source line P-MOSFET select transistors 320 (SLT), and BE-SONOS p-channel devices for each of the memory cells. The source line 325 is floating and the source line transistors 320 (SLT) have a gate voltage of Vg=0V. The bit lines 305 ($BL_1$, $BL_3$, $BL_4$) are biased with $VBL_N$=−5V, where N=1, 3 and 4, and bit line 305 $BL_2$ is biased at $V_{BL1}$=0V 307. With the gate of the bit line transistors 310 (BLT) biased at Vg=−2V, bit lines $BL_1$, $BL_3$ and $BL_4$ 305 are all turned-off and $BL_2$ 305 is turned-on, which is the selected bit line and the inversion layer 605 is formed in the NAND string 330 of $BL_2$ and the unselected bit lines have a floating inversion layer 610. All of the word lines 315 are biased at $VWL_N$=−5V, (where N=1, 2, N-1, N) with the exception of $WL_7$, which is biased at $VWL_N$=−18V 317. Therefore, the inversion layer 605 is only formed in the NAND string 330 that has the bit line transistor 310 BLT turned-on.

Figure 7:
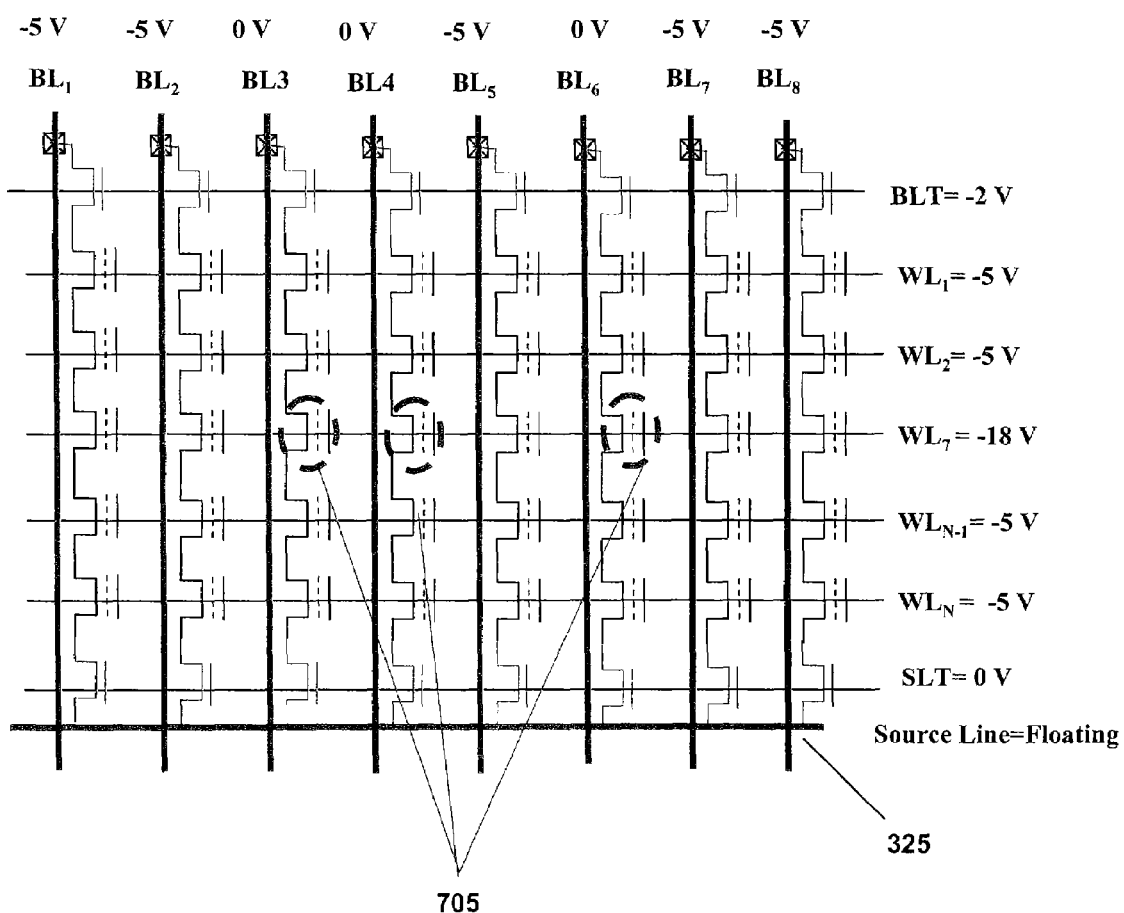
FIG. 7 is a schematic of the memory device of FIG. 3 illustrating a page program method.

FIG. 7 is a schematic of another preferred embodiment of the present invention illustrating a page program method. FIG. 7 shows a partial BE-SONOS p-channel memory device that has eight bit lines ($B_{L1}$-$BL_8$) with $BL_3$, $BL_4$ and $BL_6$ selected and biased at zero volts (i.e., $VBL_N$=0V, where N=3, 4 and 6), and the source line 325 is floating. Therefore, all the SLTs 320 (shown in FIG. 3) associated with the source line 325 are biased with a gate voltage of Vg=0V. The remaining unselected bit lines are biased at $VBL_N$=−5V, where N=1, 2, 5, 7 and 8. All of the gates associated with the bit line transistors 310 (BLT; shown in FIG. 3) are biased at Vg=−2V, causing BLTs associated with bit lines $BL_3$, $BL_4$ and $BL_6$ to be turned-on and the BLTs associated with the remaining $BL_N$ (where N=1, 2, 5, 7 and 8) to be turned-off. Word lines $WL_1$, $WL_2$, $WL_{N-1}$ and $WL_N$ are biased at $V_{WLN}$=−5V, (where N=1, 2, N-1, N) and word line $WL_7$ is biased at $V_{WL7}$=−18V, which causes cells 705 to be selected and an inversion layer to be formed in the cells. Therefore, programming of randomly-selected memory cells may be achieved. Furthermore, programming disturbance is avoided because the channel potential of the unselected cells is raised through the application of a high negative voltage to the corresponding bit-lines, thereby suppressing −FN hole injection in the unselected memory cells. Program disturbance is further avoided by floating the channel potential and suppressing hole injection in the inversion layer for the unselected bit-lines by using a program inhibit method, which includes turning on a predetermined number of bit-line transistors associated with the memory cells that are to be programmed, forming an inversion layer therein.

Figure 8:
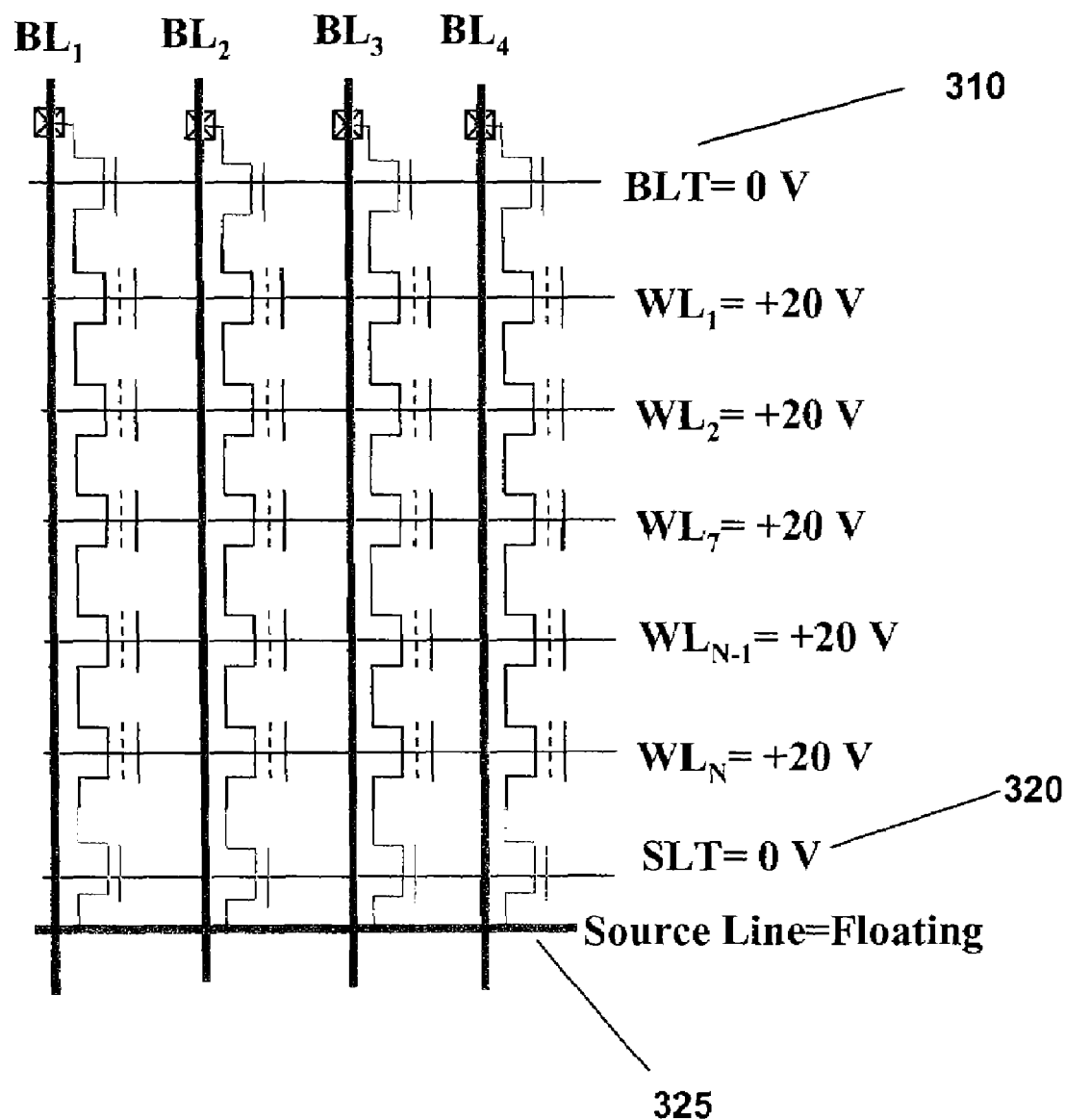
FIG. 8 is a schematic of the memory device of FIG. 3 for illustrating an erasing method.

FIG. 8 is a schematic using the device of FIG. 2 for illustrating an erasing method of a memory device consistent with one embodiment of the present invention. To facilitate the erasing method, all of the bit lines $BL_1$-$BL_4$ and the source line 325 are left floating. In addition, all of the bit line transistors 310 (BLT) and all of the source line transistors 320 (SLT) have a voltage of zero volts applied to each gate (i.e., Vg=0V). Erasing the memory device may be performed either by a sector erase or a block erase. Erasing is done by applying a high positive voltage (e.g., Vg=+20V) to the gates through each of the word lines WLN (where N=1 to N and N being the total number of word lines in the memory device). With a high positive voltage (e.g., Vg=+20V) applied to all of the word lines, electrons are injected into the charge-trapping layer from the n-well, thereby increasing the voltage threshold level for each of the memory cells that are erased. This method is termed +FN electron injection.

Figure 9:
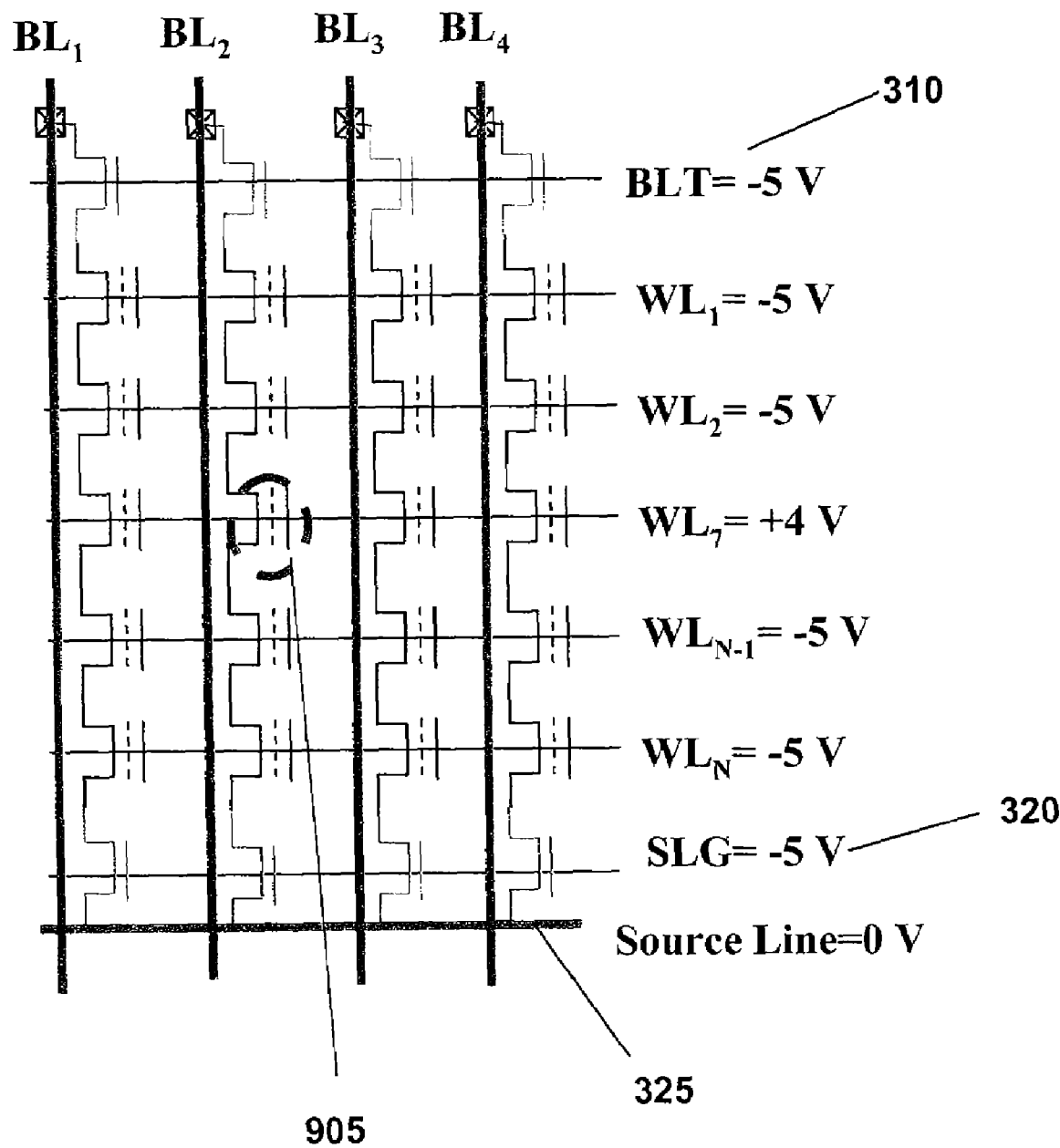
FIG. 9 is a schematic of the memory device of FIG. 3 illustrating a reading method.

FIG. 9 is a schematic of the device of FIG. 2 for illustrating a method for reading a memory cell in the NAND array of p-channel memory devices. For example, to read a memory cell 905, a negative voltage (e.g., $V_{BL1}$=−1V) is applied bit line $BL_2$ while all other bit lines ($BL_1$, $BL_3$ and $BL_4$) are left floating. In addition, a zero voltage potential ($V_{SL}$=0V) is applied to the source line 325 of the memory array. To access the cells, all of the bit line transistors 310 (BLT) and source line transistors 320 (SLT) have a negative voltage (e.g., Vg=−5V) applied to each gate, which turns on the all of the BLT and SLT transistors. To read cell 905, word line $WL_7$ is selected by applying a read gate voltage (Vg=+4V) to $WL_7$. The read gate voltage is typically between the programming gate voltage (PV) and the erasing gate voltage (EV) of the memory cells.

All remaining unselected word lines (WLN, where N=1, 2, N-1, N) have a negative gate voltage (e.g., Vg=−5V) applied since they are not being read. However, reading the memory device is not limited to individual cells. Reading can also be performed in a page read method (i.e., parallel sensing) so that a fast page read throughput can be carried out for the memory device. The page read method is done by selecting more than one bit line and word line simultaneously with the appropriate bias voltages to access more than one memory cell at the same time. The selected word lines are raised to a voltage (Vg) that is between the erasing voltage (EV) and programming voltage (PV). All other word lines serve as pass gates so that their gate voltages must be raised to $V_{CWL}$.

Figure 10A:
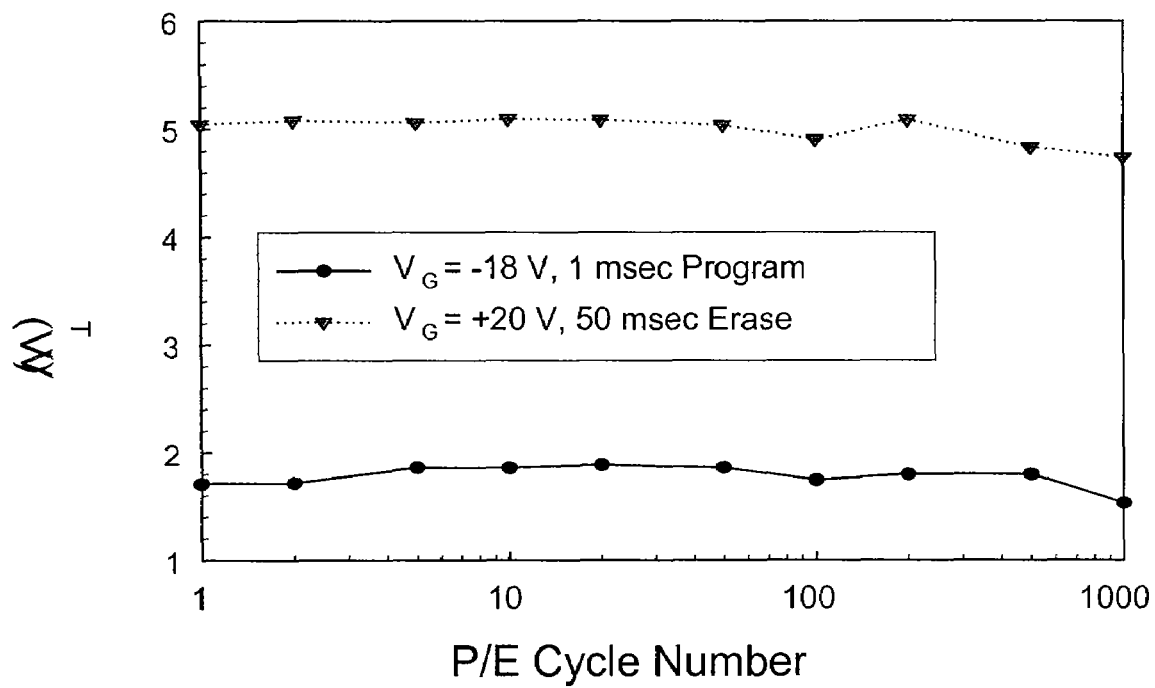
FIG. 10A is a graph illustrating the variation in threshold voltages with program/erase (P/E) cycles for the p-channel memory cell of FIG. 2.

FIG. 10A is a graph illustrating threshold voltages (Vt) versus P/E cycle number using −FN programming and +FN erasing according to preferred embodiments of the present invention. The bottom curve represents the voltage threshold (Vt) of a memory cell over for one thousand (1,000) −FN programming operations and the top curve represents the voltage threshold (Vt) over one thousand (1,000) +FN erasing operations. For each programming operation data point, the applied gate voltage was set to Vg=−18V and held for 1 millisecond. For each erasing operation data point, the applied gate voltage was set to Vg=+20V and held for 50 milliseconds. The voltage threshold for the programming curve at the bottom of the graph varied approximately between 1.7V-1.8V, which is about a 200 mV deviation over the 1,000 programming operations. Similarly, the voltage threshold for the erasing curve at the top of the graph varied approximately between 5.1V -4.8V, which is about −300 mV deviation over the 1,000 erasing operations. However, the programming and erasing curves define a voltage threshold (Vt) window between the two operations for the P/E cycle, in which the Vt window approximately remained the same throughout the 1,000 P/E cycles and illustrates an excellent program/erase (P/E) cycle endurance for the memory cell.

Figure 10B:
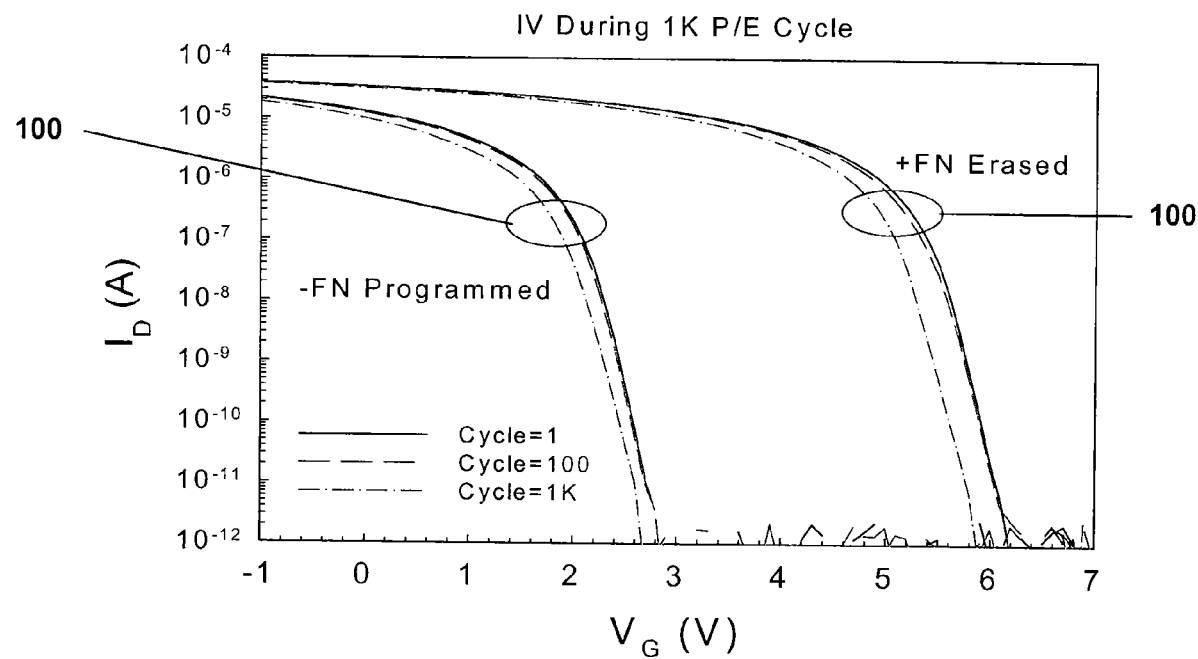
FIG. 10B is a graph showing experimental data curves in drain currents of the p-channel memory cell of FIG. 2.

FIG. 10B is a graph showing experimental curves illustrating device degradation during 1,000 P/E cycles. There are two set of three curves, the left set or grouping of curves illustrates the drain current versus gate voltage for a memory cell at 1,100 and 1,000 cycles with −FN programming operation. The right set or grouping of curves illustrates the drain current versus gate voltage for a memory cell at 1,100 and 1,000 cycles with +FN erasing operation. Both programming and erasing show that there are some changes in the curves as the cycles increased, but this change demonstrates that a small device degradation and excellent P/E cycling endurance is obtained for the memory device.

Figure 11:
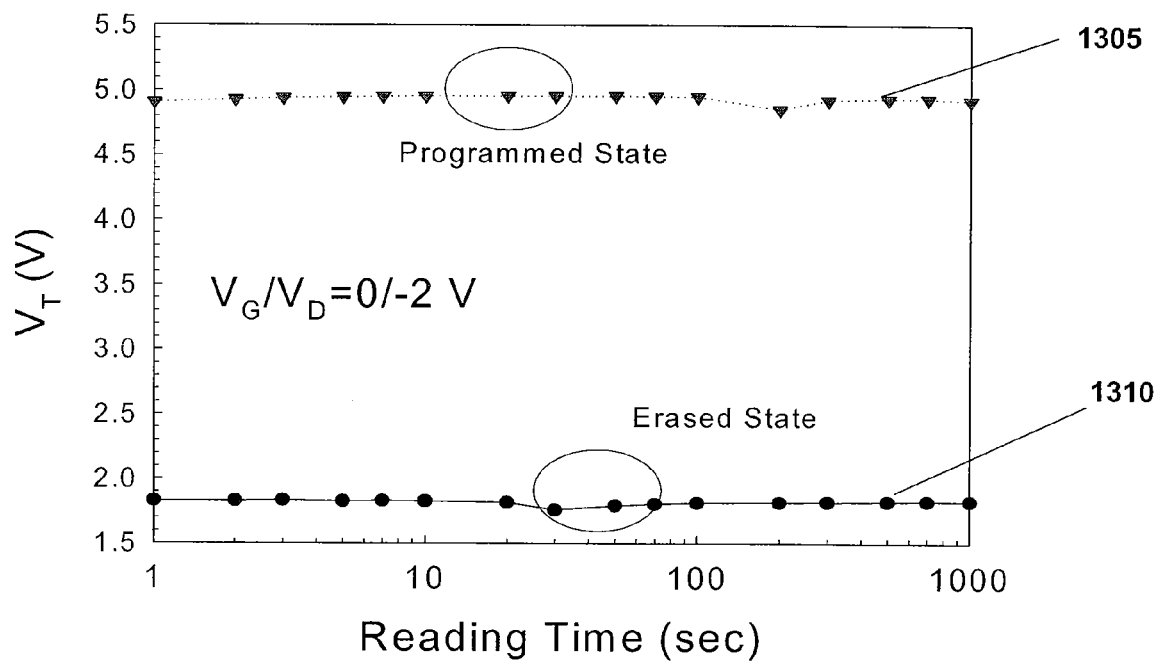
FIG. 11 is a graph of experimental data curves illustrating the variation in threshold voltages in the programmed state and the erased state as a function of reading time.

FIG. 11 is a graph of curves illustrating voltage threshold (Vt) versus reading time (second) for read disturbance characteristics of a memory cell for the device of FIG. 2. The top curve refers to the programmed state and the bottom curve refers to the erased state of the memory device with VG/VD=0/−2 V. During reading, channel hole current flows from the source to the drain in the memory cell. The channel hole current induces some electron and hole generation at the drain and some hot holes may attain enough energy to tunnel into nitride of the charge-trapping layer. However, due to the large potential barrier of hole barrier (e.g., 4.5 eV), the channel hot hole efficiency is negligible small. Therefore, the read disturbance of this p-channel device is very small and thus, results in a good read disturbance immunity in the device. The read disturbance for the p-channel device is very small as shown in FIG. 11, because channel hot-hole (CHH) efficiency is very small for PMOSFET.

The foregoing disclosure of the preferred embodiments of the present invention has been presented for purposes of illustration and description. It is not intended to be exhaustive or to limit the invention to the precise forms disclosed. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A programming method for a p-channel flash memory cell, the memory cell including a gate, a source, a drain, and a channel between the source and the drain, comprising:
   (a) applying a first voltage to the gate, and
   (b) applying a second voltage to either the source or the drain, wherein the second voltage is sufficiently greater than the first voltage so as to cause negative Fowler-Nordheim hole injection from the channel, such that the cell is caused to be in a programmed state.

2. A programming method for a memory device, the memory device comprising a NAND array of memory cells, the array comprises one or more word lines and one or more bit lines, each bit line comprises a bit line transistor connected to a string of p-channel memory cells, the string of p-channel memory cells including N series connected memory cells and the $N^{th}$ memory cell connected to a source line transistor, comprising:
   (a) applying a first voltage to each bit line that corresponds to each selected string of memory cells in the array of memory cells;
   (b) applying a second voltage to each bit line that corresponds to each unselected string of memory cells, wherein the first voltage is greater than the second voltage;
   (c) applying a third voltage to each bit line transistor, wherein the second voltage is greater than the third voltage;
   (d) applying the third voltage to each source line transistor;
   (e) applying the third voltage to each word line that corresponds to each unselected memory cell; and
   (f) applying a forth voltage to the word line that corresponds to each selected memory cell, resulting in Fowler-Nordheim hole injection, thereby causing the memory cell to be in a programmed state, wherein the third voltage is greater than the forth voltage.

3. The programming method of claim 2, wherein each of the second, third and forth voltages are negative voltages with respect to the first voltage.

4. The programming method of claim 2, wherein the Fowler-Nordheim hole injection in the unselected string of memory cells are insufficient to program the unselected memory cells.

5. The programming method of claim 2, wherein no Fowler-Nordheim hold injection occurs in a plurality of the unselected memory cells.

6. A programming method for a memory device, the memory device comprising a NAND array of memory cells, the array comprises one or more word lines and one or more bit lines, each bit line comprises a bit line transistor connected to a string of p-channel memory cells, the string of p-channel memory cells including N series connected memory cells and the $N^{th}$ memory cell connected to a source line transistor, comprising:
   (a) applying a first voltage to each bit line that corresponds to each selected memory cell in the array of memory cells;
   (b) applying a second voltage to each bit line that corresponds to each unselected memory cell, wherein the first voltage is greater than the second voltage;
   (c) applying a third voltage to each bit line transistor, wherein the second voltage is greater than the third voltage;
   (d) applying the first voltage to each source line transistor;
   (e) applying the second voltage to each word line that corresponds to each unselected memory cell; and
   (f) applying a forth voltage to the word line that corresponds to each selected memory cell, resulting in Fowler-Nordheim (−FN) hole injection, thereby causing the memory cell to be in a programmed state, wherein the third voltage is greater than the forth voltage.

7. The programming method of claim 6, wherein each of the second, third and forth voltages are negative voltages with respect to the first voltage.

* * * * *